US012578389B2

(12) United States Patent
Yoo

(10) Patent No.: US 12,578,389 B2
(45) Date of Patent: Mar. 17, 2026

(54) INSTALLATION VERIFICATION SYSTEM AND METHOD FOR ENERGY STORAGE DEVICE

(71) Applicant: Samsung SDI Co., Ltd., Yongin-si (KR)

(72) Inventor: Ji Won Yoo, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 368 days.

(21) Appl. No.: 18/180,726

(22) Filed: Mar. 8, 2023

(65) Prior Publication Data

US 2023/0314519 A1 Oct. 5, 2023

(30) Foreign Application Priority Data

Apr. 1, 2022 (KR) ........................ 10-2022-0041087

(51) Int. Cl.
*G01R 31/367* (2019.01)
*G01R 31/382* (2019.01)
(Continued)

(52) U.S. Cl.
CPC ......... *G01R 31/367* (2019.01); *G01R 31/382* (2019.01); *G01R 31/385* (2019.01);
(Continued)

(58) Field of Classification Search
USPC .......................................................... 702/63
See application file for complete search history.

(56) References Cited

U.S. PATENT DOCUMENTS 9,172,259 B2 10/2015 Hwang
9,885,759 B2 2/2018 Schipfer et al.
(Continued)

FOREIGN PATENT DOCUMENTS

CN 212627257 U 2/2021
CN 113253115 A 8/2021
(Continued)

OTHER PUBLICATIONS

Japanese Notice of Allowance for JP Application No. 2023-43095, dated Aug. 26, 2024, 3 pages.
(Continued)

*Primary Examiner* — Paul D Lee
(74) *Attorney, Agent, or Firm* — Womble Bond Dickinson (US) LLP

(57) ABSTRACT

An installation verification method including an installation information input operation including displaying a window for receiving installation information of an energy storage device, and receiving the installation information through an interface of an installation verification terminal, an installation guide operation including displaying a connection state of the energy storage device, displaying a number of battery racks in the energy storage device, receiving a software version of a rack BMS through the interface, and storing the software version of the rack BMS, an installation verification operation including receiving voltages of the battery racks, and sensing voltages and temperatures of battery modules in the battery racks to verify an installation state of the energy storage device, a report output operation including extracting the installation information to generate an installation verification report, and a lock-cancelling operation including cancelling a lock setting to enable the energy storage device to be driven.

7 Claims, 3 Drawing Sheets

(51) Int. Cl.

| | |
|---|---|
| *G01R 31/385* | (2019.01) |
| *G01R 31/396* | (2019.01) |
| *H01M 10/42* | (2006.01) |
| *H01M 10/48* | (2006.01) |

(52) U.S. Cl.

CPC ......... *G01R 31/396* (2019.01); *H01M 10/425* (2013.01); *H01M 2010/4271* (2013.01); *H01M 10/488* (2013.01)

(56) References Cited

U.S. PATENT DOCUMENTS

| | | | |
|---|---|---|---|
| 11,031,800 B2 | 6/2021 | Kosugi et al. | |
| 11,411,391 B2 | 8/2022 | Jung et al. | |
| 2012/0183813 A1* | 7/2012 | Kim | H01M 50/204 |
| | | | 429/7 |
| 2014/0145678 A1 | 5/2014 | Hwang | |
| 2015/0084598 A1* | 3/2015 | Song | H02J 13/00002 |
| | | | 320/128 |
| 2015/0293179 A1 | 10/2015 | Schipfer et al. | |
| 2018/0181967 A1 | 6/2018 | Beaston et al. | |
| 2019/0157893 A1 | 5/2019 | Kosugi et al. | |
| 2021/0249852 A1 | 8/2021 | Jung et al. | |
| 2022/0216716 A1* | 7/2022 | Han | H02J 7/0042 |

FOREIGN PATENT DOCUMENTS

| | | | |
|---|---|---|---|
| EP | 3 863 144 A1 | 8/2021 |
| JP | 2013-057542 A | 3/2013 |
| JP | 2014-108052 A | 6/2014 |
| JP | 2015-537193 A | 12/2015 |
| JP | 2018-010750 A | 1/2018 |
| JP | 6274383 B1 | 2/2018 |
| JP | 2018-190688 A | 11/2018 |
| JP | 2020-180891 A | 11/2020 |
| JP | 2021-111539 A | 8/2021 |
| JP | 2021-129494 A | 9/2021 |
| KR | 10-2229166 B1 | 3/2021 |
| KR | 10-2021-0047442 A | 4/2021 |
| WO | WO 2017/154170 A1 | 9/2017 |
| WO | WO 2018/221040 A1 | 12/2018 |

OTHER PUBLICATIONS

Guidelines for Installation of Energy Storage System (ESS) in Public Institutions, Aug. 2020, 35 pages (Abstract included—1 page).

Japanese Office Action issued in corresponding JP Application No. 2023-043095, dated Mar. 11, 2024, 4 pages.

European Search Report, Application No. 23163554.1, issued on Jul. 8, 2024, 10 pps.

* cited by examiner

INSTALLATION VERIFICATION SYSTEM AND METHOD FOR ENERGY STORAGE DEVICE

CROSS-REFERENCE TO RELATED APPLICATION

This application claims priority to, and the benefit of, Korean Patent Application No. 10-2022-0041087 filed on Apr. 1, 2022, in the Korean Intellectual Property Office, the contents of which in its entirety are herein incorporated by reference.

BACKGROUND

1. Field

Various embodiments of the present disclosure relate to an installation verification system and method for an energy storage device.

2. Description of the Related Art

In general, an energy storage system (ESS) means a device that stores surplus produced electricity or energy produced through renewable energy in a storage device (e.g., a battery), and that supplies electricity at a suitable time to improve power use efficiency.

The energy storage device includes a system battery management system (BMS) for battery monitoring and for battery condition monitoring, and also for battery control and for battery operation; a power conversion system (PCS) for charging and discharging the battery; and a battery control unit (BCU) that communicates with a BMS and a PCS to diagnose the energy storage device and to control charging and discharging.

The energy storage device is used such that a plurality of battery racks, in which battery modules, which are aggregates of a plurality of cells, are arranged and housed in a vertical direction, are in turn arranged and connected in a longitudinal direction, which is a vertical direction. The respective battery modules are vertically stacked and connected, and are electrically connected to each other in the vertical direction. Thus, electrically connected battery modules are gathered to form one rack, and the racks are electrically connected to each other to form one large-scale battery storage device.

Meanwhile, the battery management system (BMS) includes a module BMS for controlling a plurality of battery modules, a rack BMS for controlling a plurality of module BMSs, a system BMS for controlling a plurality of rack BMSs, and a battery control device for interfacing the system BMS with an upper controller. The BMS serves to provide the power stored in the plurality of battery modules to the system, or to charge the power of the system to the plurality of batteries.

The energy storage device suitably performs verification according to the installed environment, in addition to physical construction and installation works. Verification of the installation work is quite difficult for ordinary workers to check through only one installation verification document, and the error rate increases depending on the worker's proficiency, resulting in a delay in construction time. In addition, as the demand for energy storage devices increases not only domestically, but also abroad, the problem of increased costs arises due to the increase in the construction time for verification work.

SUMMARY

The present disclosure provides an installation verification system and method for an energy storage system, in which installation verification for an energy storage device can be performed through a program installed in an installation verification terminal, and thus, verification can be suitably performed, and the resulting time delay can be reduced or prevented.

An installation verification system method for an energy storage device according to one or more embodiments of the present disclosure may include an installation information input operation including displaying, on a display, an input window for receiving installation information of an energy storage device, and receiving the installation information through an interface of an installation verification terminal, an installation guide operation including displaying, on the display, a connection state of the energy storage device, displaying, on the display, a number of battery racks in the energy storage device, receiving a software version of a rack BMS through the interface, and storing the software version of the rack BMS, an installation verification operation including receiving, by the installation verification terminal, voltages of the battery racks, and sensing voltages and temperatures of battery modules in the battery racks to verify an installation state of the energy storage device, a report output operation including extracting the installation information to generate an installation verification report, and a lock-cancelling operation including cancelling a lock setting to enable the energy storage device to be driven.

The installation information input operation may further include a battery module verification operation including measuring, by sensors, the voltages and the temperatures of the battery modules, transmitting data indicating the temperatures and the voltages to the installation verification terminal through the rack BMS and through a system BMS, displaying information indicating one of the battery modules having a temperature or a voltage exceeding a respective reference value, and balancing the temperatures or the voltages of the battery modules, and a battery rack verification operation including receiving sensed voltages of the battery racks from the system BMS, receiving measured voltages of the battery racks through the interface to calculate deviations between respective ones of the sensed voltages and the measured voltages, and checking for abnormalities based on the deviations.

The battery module verification operation may further include when voltage balancing in the rack BMS is not suitable, or when replacement of an abnormal battery module is suitable, displaying, by the display, suitability for replacement, and when either the rack BMS or a module BMS is replaced, receiving an indication of the replacement through the interface.

The installation verification method may further include storing the installation information received through the interface and data received through a system BMS in a memory of the installation verification terminal, wherein the report output operation further includes generating an installation verification report by extracting the installation information stored in the memory.

The report output operation may include storing the installation verification report in the memory, and transmitting the installation verification report to another terminal through a communicator of the installation verification terminal.

The installation verification terminal may include a communicator for transmitting and receiving data to/from a system BMS of the energy storage device, the interface including one or more key buttons, the display configured to display the installation information received through the communicator or input through the interface, and a controller for executing an installation verification program for verifying installation of the energy storage device, for displaying, through the display, the installation verification program and the installation information transmitted from the energy storage device, and for storing the installation verification program and the installation information in a memory.

The battery racks may include electrically connected battery modules to which battery cells are electrically connected, configured to measure and control physical quantities of the battery cells, and including a module BMS for transmitting measured data to the rack BMS.

In addition, an installation verification system for an energy storage device according to one or more embodiments of the present disclosure may include an energy storage device including a rack BMS for controlling driving of battery racks according to physical quantities of the battery racks and of battery modules in the battery racks, and a system BMS for controlling the driving of the battery racks through the rack BMS, and including a communication module, and an installation verification terminal for receiving installation information of the energy storage device from the system BMS, and for generating a verification report indicating an installation status of the energy storage device.

The installation verification terminal may include a communicator for transmitting and receiving data to/from the system BMS, an interface including one or more key buttons, a display for displaying information corresponding to the data received through the communicator or input through the interface, and a controller for executing an installation verification program for determining the installation status of the energy storage device, for causing the display to display the installation verification program and to display the installation information transmitted from the energy storage device, and for storing the installation verification program and the installation information in memory.

The battery racks may include electrically connected battery modules to which battery cells are electrically connected, configured to measure and control physical quantities of the battery cells, and including a module BMS for transmitting measured data to the rack BMS.

The battery racks may be electrically connected to a high-power terminal through a fuse and a switch, wherein the rack BMS is configured to control connection relationships of the battery racks by controlling the fuse and switch.

The battery racks may be connected in parallel, wherein the installation verification terminal is configured to control a connection relationship between the battery racks through communication with the system BMS.

DETAILED DESCRIPTION

Figure 1:
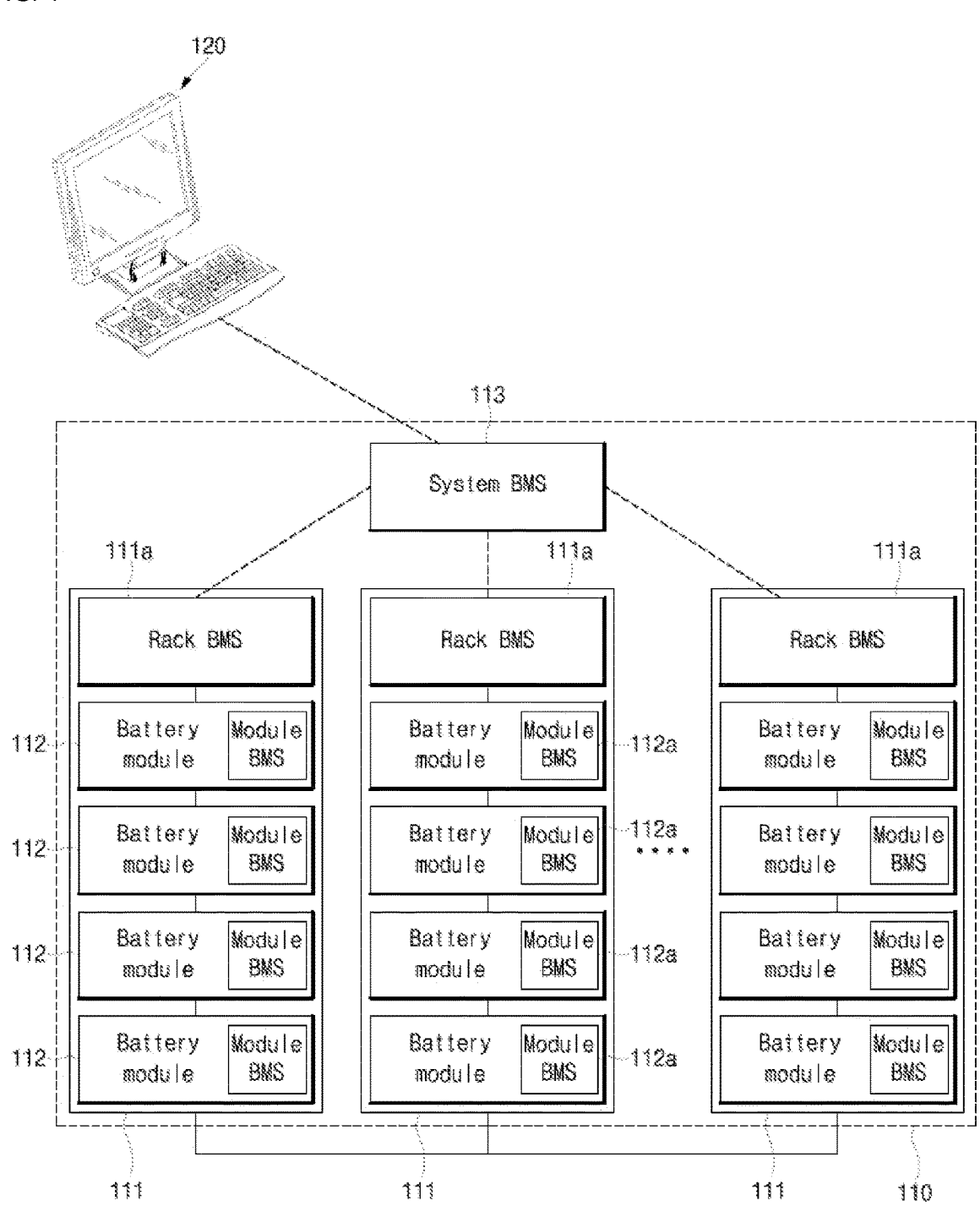
FIG. 1 is a conceptual diagram illustrating an installation verification system for an energy storage device according to embodiments of the present disclosure.

Hereinafter, embodiments of the present disclosure will be described in detail with reference to the accompanying drawings.

Embodiments of the present disclosure are provided to explain the present disclosure more completely to those skilled in the art, and the embodiments may be modified in various other forms. The present disclosure, however, may be embodied in many different forms, and should not be construed as being limited to the embodiments set forth herein. Rather, these embodiments are provided so that this disclosure will be thorough and complete, and will convey the aspects and features of the present disclosure to those skilled in the art.

In addition, in the accompanying drawings, sizes or thicknesses of various components are exaggerated for brevity and clarity. Like numbers refer to like elements throughout. In addition, it will be understood that when an element A is referred to as being "connected to" an element B, the element A can be directly connected to the element B or an intervening element C may be present therebetween such that the element A and the element B are indirectly connected to each other.

The terminology used herein is for the purpose of describing embodiments, and is not intended to be limiting of the disclosure. As used herein, the singular forms are intended to include the plural forms as well, unless the context clearly indicates otherwise. It will be further understood that the terms that the terms "comprise or include" and/or "comprising or including," when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

For the purposes of this disclosure, expressions such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression such as "at least one of A and B" and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware, to process data or digital signals. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Circuit hardware may include, for example, application specific integrated circuits (ASICs), general purpose or special purpose central processing units (CPUs) that is configured to execute instructions stored in a non-transitory storage medium, digital signal processors (DSPs), graphics processing units (GPUs), and programmable logic devices such as field programmable gate arrays (FPGAs).

Further, the various components of these devices may be a process or thread, running on one or more processors, in one or more computing devices, executing computer program instructions and interacting with other system components for performing the various functionalities described herein. The computer program instructions are stored in a memory that may be implemented in a computing device using a standard memory device, such as, for example, a random-access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Some embodiments are described in the accompanying drawings in relation to functional block, unit, and/or module. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interact individual blocks, units, and/or modules without departing from the scope of the present disclosure. In addition, in some embodiments, the block, unit and/or module may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Each of the battery racks is electrically connected to an externally exposed high-power terminal through a fuse and a switch, and the rack BMS may control the connection relationship of the respective battery racks by controlling the fuse and switch.

In addition, BMS, PCS, ECU, a control unit (controller) and/or other related devices or parts according to embodiments of the present disclosure may be implemented using any suitable hardware, firmware (e.g., application specific semiconductor), software, or a suitable combination of software, firmware, and hardware. For example, various components of BMS, PCS, ECU, a controller and/or other related devices or parts according to embodiments of the present disclosure may be formed on one integrated circuit chip or on a separate integrated circuit chip. In addition, various components of BMS, PCS, ECU, a controller and/or other related devices or parts according to embodiments of the present disclosure may be implemented on a flexible printed circuit film or may be formed on the same substrate as a tape carrier package, a printed circuit board, or BMS, PCS, ECU, or a controller. In addition, various components of BMS, PCS, ECU, or a controller may be a process or thread running on one or more processors in one or more computing devices, which may execute computer program instructions and interact with other components to perform various functions mentioned below. The computer program instructions are stored in a memory that can be executed in a computing device using standard memory devices, such as, for example, a random-access memory. The computer program instructions may also be stored on other non-transitory computer readable media, such as, for example, a CD-ROM, a flash drive, or the like. In addition, a person skilled in the art pertaining to the present disclosure will recognized that the functionality of various computing devices may be combined with each other or integrated into one computing device, or the functionality of a particular computing device may be distributed to one or more other computing devices without departing from the embodiments of the present disclosure.

Additionally, an installation verification terminal can be operated in a normal commercial computer including a central processing unit (CPU), a mass storage device, such as a hard disk or a solid-state disk, a volatile memory device, an input device, such as a keyboard or mouse, and an output device, such as a monitor or printer, but the present disclosure is not limited thereto.

Referring to FIG. 1, a conceptual diagram illustrating an installation verification system for an energy storage device according to embodiments of the present disclosure is shown. As shown in FIG. 1, the installation verification system 100 for an energy storage device may include an energy storage device 110 and an installation verification terminal 120.

First, the energy storage device 110 includes at least two battery racks 111. Here, the battery racks 111 may be electrically connected. In addition, the battery racks 111 may have high-power terminals (positive and negative electrodes) exposed to the outside, and the high-power terminals of each of the battery racks 111 may be connected in parallel. In addition, each of the battery racks 111 includes a rack BMS 111a.

The rack BMS 111a may manage and control the module BMS 112a included in the battery modules 112 included in the battery rack 111. In addition, the rack BMS 111a may measure and/or control the physical quantities (voltage, current, temperature, etc.) of the battery modules 112 included in the battery racks 111. In addition, each of the battery racks 111 may be connected to a high-power terminal through a fuse and a switch. In addition, by controlling the driving of the fuse and the switch according to the physical quantities measured in the battery modules 112, the rack BMS 111a may control the voltages of the battery modules 112 included in the battery rack 111 to be input/output from/to the outside through the high-power terminal. In addition, the rack BMSs 111a included in each of the battery racks 111 may be connected to each other through universal communication lines (e.g., CAN).

Each battery rack 111 may include electrically connected battery modules 112. The battery modules 112 included in each battery rack 111 may be connected in series and/or in parallel. Each battery module 112 also includes a module BMS 112a. The module BMS 112a may measure and/or control the physical quantities (voltage, current, temperature, etc.) of a plurality of battery cells included in the battery module 112, and transmit the resulting data to the rack BMS 111a in case of abnormality. In addition, each battery module 112 includes a plurality of battery cells connected in series and/or in parallel.

Additionally, in the energy storage device 110, the rack BMSs 111a included in each battery rack 111 may all be connected to the system BMS 113. The system BMS 113 may manage and control the rack BMSs 111a included in each battery rack (111). The system BMS 113 may be a master BMS, and the rack BMS 111a and module BMS 112a may be slave BMSs, but the present disclosure is not limited thereto.

In addition, the system BMS 113 may include a communication module capable of communicating with the installation verification terminal 120. Additionally, by receiving a driving signal transmitted from the installation verification terminal 120, the system BMS 113 may control the driving of the switch, thereby controlling the connection relationship of the battery racks 111.

Additionally, the energy storage device 110 may further include a power conversion system (PCS) for charging and discharging the energy storage device 110, and the system BMS 113 may perform communication with the installation verification terminal 120, an upper system and other systems while controlling the PCS.

Figure 2:
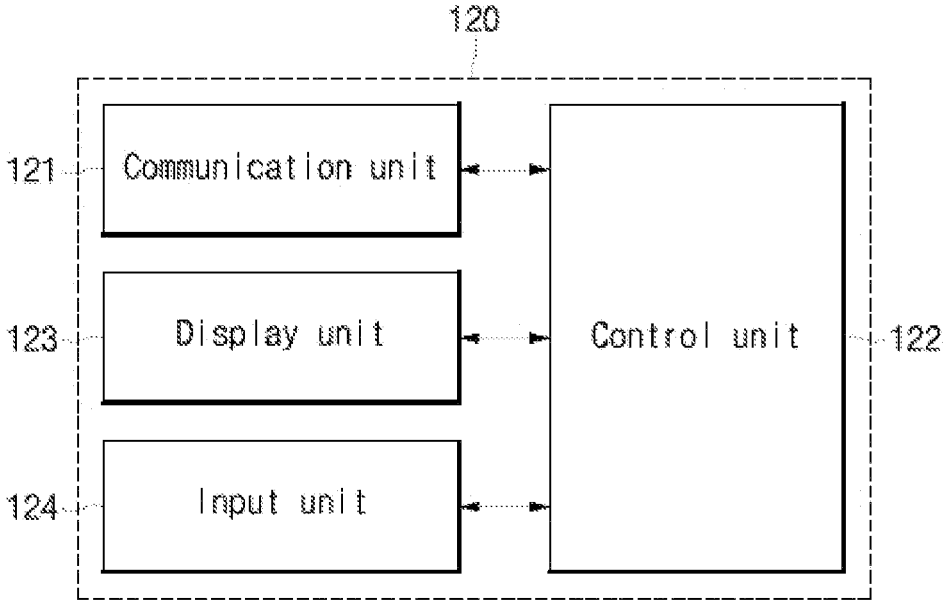
FIG. 2 is a conceptual diagram illustrating the configuration of an installation verification terminal in the energy storage device installation verification system shown in FIG. 1.

In addition, the installation verification terminal 120 may have installed thereon a program for installation verification for the energy storage device 110 may be installed. In addition, the installation verification terminal 120 may be connected through a communication network to enable communication with the system BMS 113 included in the energy storage device 110. The installation verification terminal 120 may include, as shown in FIG. 2, a communication unit (communicator) 121, a control unit (controller) 122, a display unit (display) 123, and an input unit (interface) 124. Here, by receiving data from the system BMS 113 through the communication network, and by controlling an electrical connection, the installation verification terminal 120 may verify the installation state of the energy storage device 110, and may generate an installation verification report of the energy storage device 110.

Here, the communicator 121 is a generic term for a communication configuration capable of communicating with the system BMS 113 through a communication network, and may include at least one of an antenna for transmitting and receiving radio frequency signals of a corresponding frequency band, an RF module, a baseband module, a signal processing module, and/or a wired communication module. The communicator 121 may be connected to the controller 122 through a bus. The communicator 121 may transmit a signal for controlling an electrical connection relationship of the energy storage device 110 under the control of the controller 122. The communicator 121 may be a communication module capable of transmitting/receiving data with the energy storage device 110.

A program for installation verification may be installed in the controller 122, and the installation verification information received through the communicator 121 of the installation verification terminal 120, and the installation verification information input through the interface 124, may be processed and displayed on the display 123. In addition, the controller 122 may store the information received through the communicator 121, and the information input through the interface 124, in a memory included in the controller 122. Here, the memory may be provided as a separate component or may be database.

The display 123 may be a device that displays content selected through the interface 124. For example, when a program for verifying installation of the energy storage device 110 is executed through the interface 124, a suitable configuration input through the interface 124 may be displayed at each operation.

The interface 124 may include a key input device having one or more key buttons (or a touch screen device interlocking with the display), and an input module for driving the key input device. The interface 124 may be a means for inputting an input to an allocated area where inputting is suitable on the screen displayed on the display 123. In addition, the interface 124 may input a control signal for controlling the energy storage device 110 according to the content displayed on the display 123 under the control of the controller 122.

The installation verification terminal 120 will now be described in detail through the installation verification method of the installation verification system for an energy storage device, shown in FIGS. 3 and 4.

Figure 3:
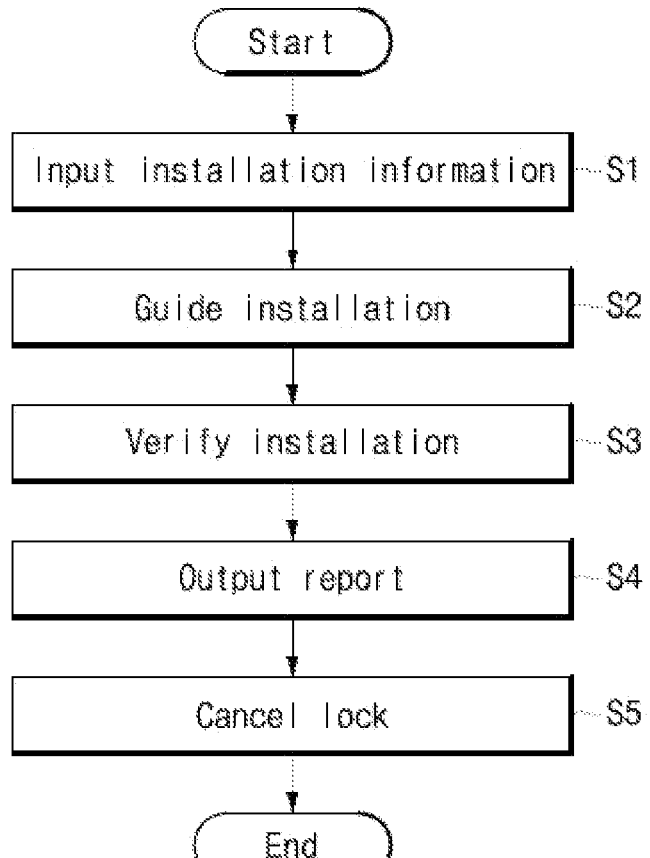
FIG. 3 is a flowchart illustrating an installation verification method of an installation verification system for an energy storage device according to embodiments of the present disclosure.

Referring to FIG. 3, there is shown a flowchart illustrating an installation verification method of an installation verification system for an energy storage device according to embodiments of the present disclosure. In addition, referring to FIG. 4, there is shown a flowchart illustrating various operations of the installation verification method of an installation verification system for an energy storage device shown in FIG. 3. Hereinafter, the installation verification method of the installation verification system for an energy storage device will be described with reference to FIGS. 1 to 4.

Figure 4:
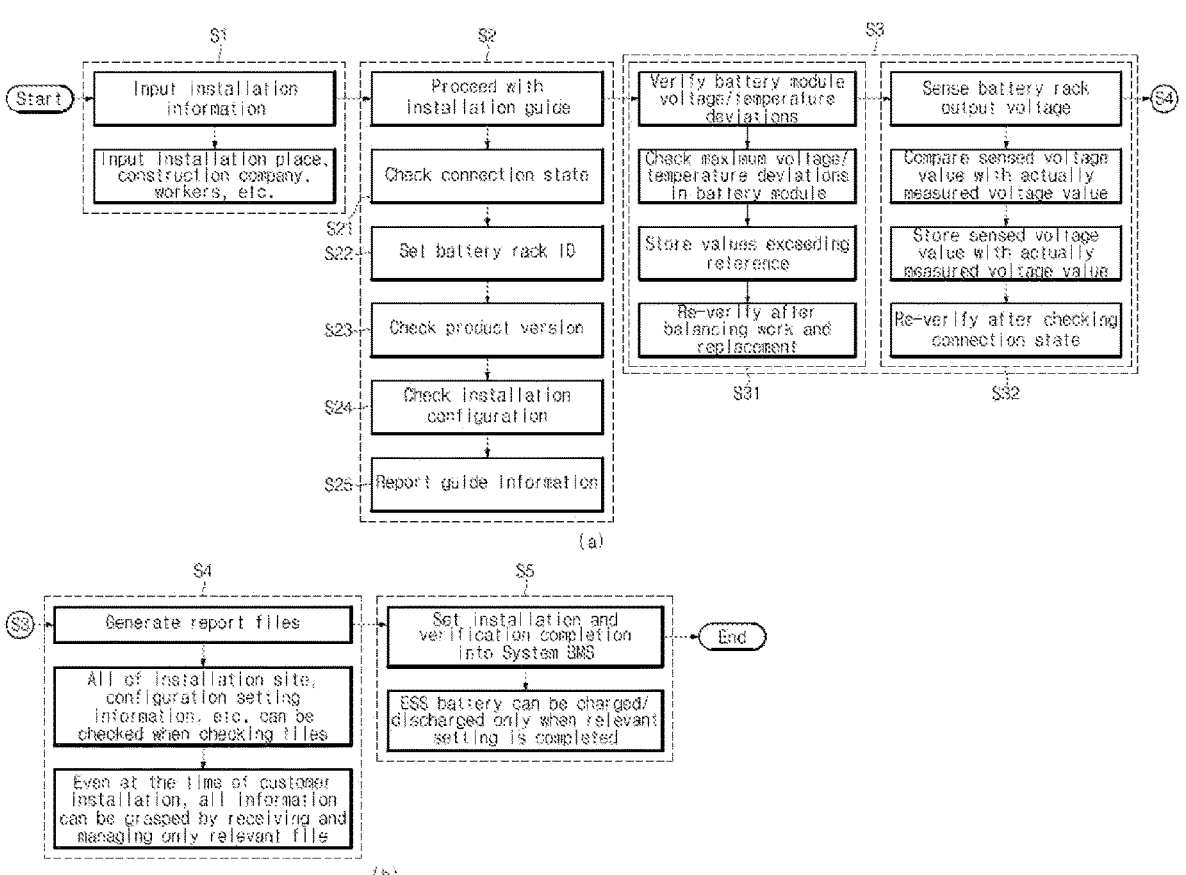
FIG. 4 is a flowchart specifically illustrating various operations of the installation verification method of an installation verification system for an energy storage device shown in FIG. 3.

First, as shown in FIGS. 3 and 4, the installation verification method of an installation verification system for an energy storage device may include an installation information input operation (S1), an installation guide operation (S2), an installation verification operation (S3), a report output operation (S4), and a lock-cancelling operation (S5).

First, in the installation information input operation (S1), when the installation verification program is executed in the installation verification terminal 120, installation information of the energy storage device 110 for installation verification may be requested. That is, in the installation verification terminal 120, an input window for the installation information about the energy storage device 110 to be installed, and which is to be suitably verified, is displayed on the display 123, and the installation information may be input through the interface 124. Here, the installation information of the energy storage device 110 may include a place where the energy storage device 110 is installed, the number of the energy storage device 110 that is suitable for installation verification at the installation place, a worker, a construction company, types of the system BMS 113 and/or of the rack BMS 111a, and so on. In addition, the installation information that is input in the installation information input operation (S1) may be stored in a memory provided in the controller 122 of the installation verification terminal 120.

In the installation guide operation (S2), the installation guide for checking the installation state of the energy storage device 110 through the installation verification terminal 120 may be performed. Here, the installation guide operation (S2) may include a connection-state-checking operation (S21), a battery-rack-ID-setting operation (S22), a rack-BMS-product-version-checking operation (S23), an installation-configuration-checking operation (S24), and a guide-information-reporting operation (S25).

First, in the connection-state-checking operation (S21), the installation verification terminal 120 may display a connection state between components in the energy storage device 110 through the display 123 to allow for checking of the connection state. Here, the checking of the connection state may mean checking a communication line connection state, which is a connection state between each of the module BMS 112a, the rack BMS 111a, and the system BMS 113, and checking a power line connection state, which is a connection state between each of the battery cell, the battery module 112, and the battery rack 111. Additionally, the installation verification terminal 120 may display an abnormal part in the connection state of the communication line and the power line of the energy storage device 110 through the display 123, thereby allowing a worker to check the abnormal connection part.

In the battery-rack-ID-setting operation (S22), the installation verification terminal 120 may impart an ID of each battery rack 111 to which power is connected while sequentially connecting the power of the plurality of battery racks 111 included in the energy storage device 110. Here, the ID of each battery rack 111 may be automatically imparted by the installation verification program of the installation verification terminal 120. Additionally, the installation verification terminal 120 may check the number of battery racks 111 included in the energy storage device 110 while automatically imparting IDs of the battery racks 111. In addition, the installation verification terminal 120 may store the numbers and IDs of the battery racks 111 in the memory of the controller 122.

In the rack-BMS-product-version-checking operation (S23), the installation verification terminal 120 may display the software version installed in the rack BMS 111a through the display 123. Here, the installation verification terminal 120 may communicate with the system BMS 113 included in the energy storage device 110 to display and check the software version of each rack BMS 111*a*.

Here, the rack-BMS-product-version-checking operation (S23) may proceed concurrently or substantially simultaneously with the battery-rack-ID-setting operation (S22). In one or more embodiments, the installation verification terminal 120 may display the software version of the rack BMS 111*a* at the same time while automatically setting the ID of each battery rack 111 included in the energy storage device 110. In addition, the installation verification terminal 120 may store information on the software version of the rack BMS (111*a*) in the memory of the controller 122.

In the installation-configuration-checking operation (S24), an input window for inputting the number of battery modules 112 included in each battery rack 111 may be displayed on the display 123 of the installation verification terminal 120. Here, the installation verification terminal 120 may receive input information of the number of battery modules 112 included in each battery rack 111 through the interface 124. In addition, the installation verification terminal 120 may store the number of battery modules 112 included in each battery rack 111.

In the guide-information-reporting operation (S25), the installation verification terminal 120 may display pieces of guide information input in the installation guide operation (S2) through the display 123, so that the pieces of guide information can be checked and reviewed. In addition, the installation verification terminal 120 may also display abnormal information, among the guide information that is input during the installation guide operation (S2), through the display 123. For example, the guide information indicating an abnormality may mean the case of being skipped without being input through the interface 124 in each operation of the installation guide operation (S2), or may mean the case in which the input information does not match the information that is checked during communication with the system BMS 113. Here, the installation verification terminal 120 may extract, in the guide-information-reporting operation (S25), the information stored in the memory of the controller 122 in each operation of the installation guide operation (S2) to display the same through the display 123.

In the installation verification operation (S3), the installation verification terminal 120 may receive the voltages and temperatures measured by temperature and voltage sensors included in the energy storage device 110, and may verify the installation state of the energy storage device 110. The installation verification operation (S3) may include a battery module verification operation (S31) and a battery rack verification operation (S32). Here, the installation verification operation (S3) will be described with respect to a case in which the battery module verification operation (S31) is first performed, and the battery rack verification operation (S32) is then performed. However, in one or more embodiments, the battery rack verification operation (S32) may first be performed, and the battery module verification operation (S31) may then be performed, and the order may be changed.

In addition, the installation verification operation (S3) may be sequentially performed one by one for the plurality of battery racks 111 included in the energy storage device 110. Here, the battery racks 111 may be sequentially selected from the installation verification terminal 120 in the ID order set in the installation guide operation (S2). In addition, to measure the voltage of each of the battery racks 111 connected in parallel in the installation verification operation (S3), the installation verification terminal 120 may control the electrical connection relationship through the rack BMSs 111*a*.

In the battery module installation verification operation (S31), the voltage and temperature deviations between the battery modules 112 included in a selected one of the battery racks 111 may be displayed on the display 123.

Here, the voltages and temperatures of the battery modules 112 included in the battery rack 111 may be measured by temperature and voltage sensors included in each battery module 112, and may be transmitted to each module BMS 112*a*. In addition, each module BMS 112*a* may transmit the temperature and voltage values of each battery module 112 to the rack BMS 111*a* that is an upper BMS. That is, the rack BMS 111*a* may receive the temperature and voltage of each of the battery modules 112 included in the battery rack 111. In addition, the rack BMS 111*a* may transmit the temperature and voltage values of the battery modules 112 included in the battery rack 111 to the system BMS 113. Thereafter, the system may transmit, through a communication line, the temperature and voltage values of the battery modules 112 included in the battery rack 111 to the installation verification terminal 120.

The installation verification terminal 120 may calculate the temperature and voltage deviations of the battery modules 112 included in the battery rack 111, which may be received through the communicator 121, through the controller 122, and may display the calculated deviations through the display 123. In addition, the installation verification terminal 120 may check for abnormal battery modules 112 that exceed set reference values among the temperature and voltage values of the plurality of battery modules 112, and may display the same through the display 123 to guide a worker/user. Of course, the installation verification terminal 120 may store the information about the abnormal battery module 112 in a memory included in the controller 122. In addition, the installation verification terminal 120 may request a balancing operation so that the voltage between the battery modules 112 included in the battery rack 111 becomes similar to the system BMS 113, and through the rack BMS 111*a* and the module BMS 112*a*, voltages between the battery modules 112 included in the battery rack 111 may be balanced.

Additionally, when the rack BMS 111*a* and/or the module BMS 112*a* cannot perform voltage balancing, or when there is an abnormal battery module 112, the installation verification terminal 120 may request replacement of the rack BMS 111*a* and/or the module BMS 112*a* through the display 123. Here, the worker may replace the rack BMS 111*a* and/or the module BMS 112*a* at the request of the installation verification terminal 120. In addition, after the rack BMS 111*a* and/or the module BMS 112*a* are replaced, the worker may input that the rack BMS 111*a* and/or the module BMS 112*a* are replaced through the interface 124 of the installation verification terminal 120, and the battery module verification operation (S31) may be re-executed. In addition, the installation verification terminal 120 may store the replacement history entered by the worker through interface 124 in the memory of the controller 122.

In the battery rack verification operation (S32), the installation verification terminal 120 may display the output voltage of the battery rack 111, which is selected from among the battery racks 111 included in the energy storage device 110, through the display 123. Here, the output voltage of the battery rack 111 may be measured through a rack output voltage sensor included in the battery rack 111. In addition, the rack BMS 111*a* included in each battery rack

111 may transmit the output voltage of the battery rack 111 measured by the rack output voltage sensor to the installation verification terminal 120. Here, the installation verification terminal 120 may make only the selected battery rack 111 maintained at an electrically connected state. In addition, the worker may measure the voltage of the battery rack 111 through the actual measurement through a large-power line of the selected battery rack 111, and may input the same through the interface 124 of the installation verification terminal 120. The installation verification terminal 120 may compare the sensed voltage that is measured by the rack BMS 111*a* and the actually measured voltage that is input through the interface 124 in the controller 122, and may store a deviation between the two values in the memory provided in the controller 122. In addition, the installation verification terminal 120 may display the measured voltage and the sensed voltage of the selected battery rack 111 through the display 123. Here, the worker may check whether there is an abnormality through the actual measurement and sensing voltage information displayed on the display 123.

For example, when the sensing voltage displayed on the display 123 of the installation verification terminal 120 is continuously displayed as 0, the presence or absence of abnormality may be determined by the worker from the feature wherein communication between the rack BMS 111*a* and the installation verification terminal 120 of the battery rack 111 is not connected. In one or more other embodiments, when the measured voltage value is continuously measured as negative on the display 123 of the installation verification terminal 120, the presence or absence of abnormality may be determined by the worker from the feature wherein the negative electrode and the positive electrode are connected opposite to each other.

Additionally, the installation verification terminal 120 may store the deviation between the sensed voltage and the actually measured voltage in the memory of the controller 122. In addition, the installation verification terminal 120 may receive an input through the interface 124 when the worker changes the connection state of the battery rack 111. In addition, when the installation verification terminal 120 inputs that the worker changes the connection state of the battery rack 111 through the interface 124 of the installation verification terminal 120, the battery rack verification operation (S32) may be re-executed. In addition, the installation verification terminal 120 may store a connection state change history of the energy storage device 110 input by the worker through the interface 124 in the memory of the controller 122. That is, the installation verification terminal 120 may store the changed or measured installation verification history in the memory of the controller 122 in each operation of the installation verification operation (S3).

In the report output operation (S4), a report may be prepared by extracting information stored in the memory of the controller 122 by the installation verification terminal 120. In one or more embodiments, the installation verification terminal 120 may extract the guide information stored in the memory of the controller 122, and may extract the installation verification information stored during the installation guide operation (S2) in the memory of the controller 122, so that an installation verification report may be prepared and stored in the memory of the controller 122 as a separate file.

Here, the installation verification terminal 120 may transmit the installation verification report to another terminal through the communicator 121. For example, another terminal may be a terminal of a company that manufactures and installs the energy storage device 110, and the company that manufactures and installs the energy storage device 110 may also check and grasp the state of the energy storage device 110 through the installation verification report transmitted.

In the lock-cancelling operation (S5), when the report output operation (S4), the installation verification terminal 120 may cancel the lock setting so that the energy storage device 110 can be charged and discharged through communication with the system BMS 113 so as to allow the energy storage device 110 to be driven. That is, in the lock-cancelling operation (S5), installation verification terminal 120 may transmit a lock-cancelling signal to the system BMS to enable driving of the energy storage device 110, and locking of charging and discharging in the energy storage device 110 may be cancelled under the control of the system BMS, to thereby enable driving of the energy storage device 110. In this way, the locking of charging/discharging in the energy storage device 110 is cancelled, and installation verification of the energy storage device 110 may be completed.

The installation verification method of the installation verification system for the energy storage device can proceed through input and control sequentially in the order that is suitable for the installation verification program installed in the installation verification terminal 120, and thus, the installation verification method of the installation verification system for the energy storage device may be independent of the skill level of the worker. In addition, in the installation verification method, the driving of the energy storage device 110 is not individually checked while checking separate documents, and thus a delay in work time can be reduced or prevented.

As described above, in an installation verification system and a method for an energy storage system, installation verification for an energy storage device can be performed through a program installed in an installation verification terminal, and thus, verification can be suitably performed, and the resulting time delay can be reduced or prevented.

While the foregoing embodiments are for carrying out the installation verification system and method for an energy storage device, it will be understood by a person skilled in the art that various changes in form and details may be made therein without departing from the spirit and scope of the present disclosure as defined by the following claims, with functional equivalents thereof to be included therein.

What is claimed is:

1. An installation verification method for an energy storage device, the method comprising:
    an installation information input operation comprising:
        displaying, on a display, an input window for receiving installation information of an energy storage device; and
        receiving the installation information through an interface of an installation verification terminal;
    an installation guide operation comprising:
        displaying, on the display, a connection state of the energy storage device;
        displaying, on the display, a number of battery racks in the energy storage device;
        receiving a software version of a rack battery management system (BMS) through the interface; and
        storing the software version of the rack BMS;
    an installation verification operation comprising:
        receiving, by the installation verification terminal, voltages of the battery racks; and sensing voltages and temperatures of battery modules in the battery racks to verify an installation state of the energy storage device;

a report output operation comprising extracting the installation information to generate an installation verification report; and a lock-cancelling operation comprising cancelling a lock setting to enable the energy storage device to be driven.

2. The installation verification method of claim 1, wherein the installation information input operation further comprises:

a battery module verification operation comprising:

measuring, by sensors, the voltages and the temperatures of the battery modules;

transmitting data indicating the temperatures and the voltages to the installation verification terminal through the rack BMS and through a system BMS;

displaying information indicating one of the battery modules having a temperature or a voltage exceeding a respective reference value; and balancing the temperatures or the voltages of the battery modules; and a battery rack verification operation comprising:

receiving sensed voltages of the battery racks from the system BMS;

receiving measured voltages of the battery racks through the interface to calculate deviations between respective ones of the sensed voltages and the measured voltages; and checking for abnormalities based on the deviations.

3. The installation verification method of claim 2, wherein the battery module verification operation further comprises:

when voltage balancing in the rack BMS is not suitable, or when replacement of an abnormal battery module is suitable, displaying, by the display, suitability for replacement; and when either the rack BMS or a module BMS is replaced, receiving an indication of the replacement through the interface.

4. The installation verification method of claim 1, further comprising storing the installation information received through the interface and data received through a system BMS in a memory of the installation verification terminal, wherein the report output operation further comprises generating the installation verification report by extracting the installation information stored in the memory.

5. The installation verification method of claim 4, wherein the report output operation comprises:

storing the installation verification report in the memory; and transmitting the installation verification report to another terminal through a communicator of the installation verification terminal.

6. The installation verification method of claim 1, wherein the installation verification terminal comprises:

a communicator for transmitting and receiving data to/from a system BMS of the energy storage device;

the interface comprising one or more key buttons;

the display configured to display the installation information received through the communicator or input through the interface; and a controller for executing an installation verification program for verifying installation of the energy storage device, for displaying, through the display, the installation verification program and the installation information transmitted from the energy storage device, and for storing the installation verification program and the installation information in a memory.

7. The installation verification method of claim 1, wherein the battery racks comprise electrically connected battery modules to which battery cells are electrically connected, configured to measure and control physical quantities of the battery cells, and comprising a module BMS for transmitting measured data to the rack BMS.

* * * * *